(12) United States Patent
Kim et al.

(10) Patent No.: US 8,013,956 B2
(45) Date of Patent: Sep. 6, 2011

(54) FRONT FILTER IN A FLAT PANEL DISPLAY DEVICE

(75) Inventors: Kyung Ku Kim, Seoul (KR); Hong Rae Cha, Seoul (KR); Young Sung Kim, Kyunggi-do (KR); Myeong Soo Chang, Kyunggi-do (KR); Byung Gil Ryu, Seoul (KR)

(73) Assignee: LG Electronics Inc., Seoul (KR)

( * ) Notice: Subject to any disclaimer, the term of this patent is extended or adjusted under 35 U.S.C. 154(b) by 374 days.

(21) Appl. No.: 11/524,542

(22) Filed: Sep. 20, 2006

(65) Prior Publication Data

US 2007/0013833 A1    Jan. 18, 2007

Related U.S. Application Data

(62) Division of application No. 10/817,233, filed on Apr. 1, 2004, now Pat. No. 7,119,858.

(30) Foreign Application Priority Data

Apr. 1, 2003 (KR) .............................. 10-2003-20558

(51) Int. Cl.
*G02F 1/1333* (2006.01)

(52) U.S. Cl. ....................................................... 349/110

(58) Field of Classification Search .................... 349/110
See application file for complete search history.

(56) References Cited

U.S. PATENT DOCUMENTS

| | | |
|---|---|---|
| 6,429,587 B1 | 8/2002 | Sugimachi et al. |
| 6,833,665 B2 | 12/2004 | Wachi et al. |
| 2002/0033661 A1* | 3/2002 | Sugimachi et al. ........... 313/479 |
| 2002/0042162 A1 | 4/2002 | Tone et al. |
| 2003/0094296 A1* | 5/2003 | Kojima et al. ........... 174/35 MS |
| 2004/0074655 A1* | 4/2004 | Takahashi et al. ....... 174/35 MS |

FOREIGN PATENT DOCUMENTS

| | | |
|---|---|---|
| CN | 1399304 A | 2/2003 |
| EP | 1180781 | 2/2002 |
| EP | 1253816 | 10/2002 |
| EP | 1372369 | 12/2003 |
| JP | 11-311950 | 11/1999 |
| JP | 2002268565 | 9/2002 |
| JP | 2002-323881 | 11/2002 |
| JP | 2002323861 | 11/2002 |
| JP | 2003086991 | 3/2003 |
| KR | 20030007056 | 1/2003 |
| WO | 02071824 | 9/2002 |

* cited by examiner

*Primary Examiner* — Uyen-Chau N Le
*Assistant Examiner* — Hoang Tran
(74) *Attorney, Agent, or Firm* — Lee, Hong, Degerman, Kang & Waimey

(57) ABSTRACT

A front filter being attached to a front surface of a flat panel display device includes a NIR (near infrared ray) blocking film for blocking the emission of near infrared rays to outside; an EMI (electromagnetic interference) shielding film for absorbing electromagnetic waves and for preventing the electromagnetic waves from being emitted to outside; a glass formed on a front surface of the EMI shielding film; and an antireflection coating for preventing incident rays from outside from reflecting back to the outside, in which the EMI shielding film includes a mesh unit formed of conductive meshes that are intersected with each other; and a mesh frame for surrounding the mesh unit to support the mesh unit and to define an effective display area on a screen.

7 Claims, 4 Drawing Sheets

FRONT FILTER IN A FLAT PANEL DISPLAY DEVICE

CROSS REFERENCE TO RELATED APPLICATIONS

This application is a division of U.S. application Ser. No. 10/817,233, filed Apr. 1, 2004, now U.S. Pat. No. 7,119,858, which pursuant to 35 U.S.C. §119(a) claims the benefit of earlier filing date and right of priority to Korean Application No. 10-2003-20558, filed on Apr. 1, 2003, the contents of which are hereby incorporated by reference herein in their entirety.

BACKGROUND OF THE INVENTION

1. Field of the Invention

The present invention relates in general to an EMI (electromagnetic Interference) shielding film and a front filter including the same in a flat panel display device, more particularly, to an EMI shielding film and a front filter including the same in a flat panel display device, wherein a manufacturing process for the EMI shielding layer is much simplified and thus, its cost of manufacture is considerably lowered.

2. Discussion of the Background Art

Thanks to the technological developments in recent years, flat panel displays have come into wide use. Typical examples of flat panel displays are LCDs (liquid crystal displays) and plasma display panels.

Particularly, plasma display panels (hereinafter referred to as PDPs) display images including characters or graphics by irradiating phosphors out of 147 nm-ultraviolet rays that are generated by a discharge of different compositions of inert gas mixtures, such as, He+Xe, Ne+Xe or He+Ne+Xe.

The PDP technology is now at mass production stage, and recent advances in PDP technologies made easier to manufacture slim PDPs and to provide highly improved picture quality. Especially, in case of a three-electrode alternating current (AC) surface-discharge PDP, charge particles formed by a discharge (i.e. wall charges) are stacked on the surface, which in turn protect electrodes from sputtering originated by the discharge. Therefore, the three-electrode AC surface discharge PDP consumes less voltage and has a long lifespan.

FIG. 1 is a perspective view of a discharge cell structure of a related art PDP.

Referring to FIG. 1, a discharge cell of the three-electrode AC surface-discharge PDP includes a scan electrode (Y) and a sustain electrode (Z) formed on an upper substrate 10, and an address electrode (X) formed on a lower substrate 18. The scan electrode (Y) and the sustain electrode (Z) respectively includes transparent electrodes (12Y and 12Z), and bus electrodes (13Y and 13Z) formed on an edge of the transparent electrodes (12Y and 12Z) and having a smaller line width than that of the transparent electrodes (12Y and 12Z).

In general, the transparent electrodes (12Y and 12Z) are made from Indium-Tin-Oxide (ITO) and formed on the upper substrate 10. The bus electrodes (13Y and 13Z) are typically made of metals like chrome (Cr) and formed on the transparent electrodes (12Y and 12Z). The major function of the bus electrodes (13Y and 13Z) is reducing voltage drop caused by the highly resistive transparent electrodes (12Y and 12Z). Also, an upper dielectric layer 14 and a protective film 16 are layered on the upper substrate 10 on which the scan electrode (Y) and the sustain electrode (Z) are formed side by side. The charge particles generated by a plasma discharge (i.e. wall charges) are stacked on the upper dielectric layer 14. The protective film 16 protects the upper dielectric layer 14 from damages caused by a sputtering during the plasma discharge, and improves the emission efficiency of secondary electrons. The protective film 16 is usually made from magnesium oxide (MgO).

A lower dielectric layer 22 and a barrier rib 24 are formed on the lower substrate 18 provided with the address electrode (X). The surface of the lower dielectric layer 22 and the barrier rib 24 are coated with fluorescent layers 26. The address electrode (X) is formed at right angles to the scan electrode (Y) and the sustain electrode (Z). The barrier rib 24 is formed in a strip or lattice pattern, and prevents ultraviolet rays and visible rays generated by a discharge from being leaked to the adjacent discharge cells.

The fluorescent layers 26 are excited by ultraviolet rays generated during the plasma discharge to generate one of visible rays in red, blue, or blue. A mixed inert gas is injected into a discharge space defined between the upper and lower substrates 10 and 18 and the barrier rib 24.

In the PDP with the above-described discharge cell structure, a front filter 30 is installed at the upper substrate 10, as shown in FIG. 2, in order to shield electromagnetic wave and to prevent reflection of external light.

There are two types of front filters 30: glass type front filters and film type front filters. Both glass type front filters and film type front filters are provided with an EMI shielding film 34, as shown in FIG. 3, to shield electromagnetic waves generated from the PDP.

The EMI shielding film 34 includes a mesh unit 38 provided with conductive meshes 36, a mesh frame 32 for surrounding the outside of the mesh unit 38, and a black frame 40 superposed upon the mesh unit 38 and the mesh frame 32.

The mesh unit 38 is formed of conductive meshes 36 being intersected with each other. To create the conductive meshes 36, a mesh metal layer of silver (Ag) or copper (Cu) undergoes a photolithography process. These intersected conductive meshes 36 provide square shaped holes tilted at a bias angle (θ) to transmit visible light rays therethrough.

The mesh frame 32 surrounds the outside of the mesh unit 38 to support the mesh unit 38. Also, the mesh frame 32 and a case (not shown) electrically connected to the mesh frame 32 are earthed to a ground voltage, and absorb electromagnetic waves emitted from the PDP and discharge them. In this manner, the electromagnetic waves are not emitted to outside. The mesh frame 32 is usually made from silver (Ag)) or copper (Cu).

The black frame 40 defines an effective display area to make outlines of the screen visibly distinctive. The black frame 40 is relatively broader than the mesh frame 30, and made from black ceramic materials.

A related art black frame for the glass type front filter was formed by depositing a black ceramic material on the surface of a glass substrate (not shown) and then performing a patterning process thereon. However, because the related art method required an additional process for forming the black frame, the overall process got more complicated.

SUMMARY OF THE INVENTION

An object of the invention is to solve at least the above problems and/or disadvantages and to provide at least the advantages described hereinafter.

Accordingly, one object of the present invention is to solve the foregoing problems by providing an EMI shielding film and a front filter including the same in a flat panel display device, wherein a manufacturing process for the EMI shielding layer is much simplified and thus, its cost of manufacture is considerably lowered.

Another object of the invention is to provide an EMI shielding film and a front filter including the same in a flat panel display device, wherein the structure of the EMI shielding film is much simplified by removing a black frame that determines an effective display area on the screen.

The foregoing and other objects and advantages are realized by providing a front filter in a flat panel display device, the front filter being attached to a front surface of the flat panel display device and including a NIR (near infrared ray) blocking film for blocking the emission of near infrared rays to outside; an EMI (electromagnetic interference) shielding film for absorbing electromagnetic waves and for preventing the electromagnetic waves from being emitted to outside; a glass formed on a front surface of the EMI shielding film; and an antireflection coating for preventing incident rays from outside from reflecting back to the outside, wherein the EMI shielding film includes a mesh unit formed of conductive meshes that are intersected with each other; and a mesh frame for surrounding the mesh unit to support the mesh unit and to define an effective display area on a screen.

The front filter further includes an antireflection coating between the front surface of the flat panel display device and the NIR blocking film so that the antireflection coating prevents incident rays from outside from reflecting back to the outside.

Another aspect of the invention provides a front filter in a flat panel display device, the front filter being attached to a front surface of the flat panel display device and including a NIR (near infrared ray) blocking film for blocking the emission of near infrared rays to outside; an EMI (electromagnetic interference) shielding film for absorbing electromagnetic waves and for preventing the electromagnetic waves from being emitted to outside; and an antireflection coating for preventing incident rays from outside from reflecting back to the outside, wherein the EMI shielding film includes a mesh unit formed by patterning a two-layered base film of PEP (poly ethylene terephthalate) and metal foils; and a mesh frame for surrounding the mesh unit, the mesh frame having a two-layered structure of PEP (poly ethylene terephthalate) and metal foils.

Still another aspect of the invention provides an EMI (electromagnetic interference) shielding film of a flat panel display device, in which the EMI shielding film includes: a mesh unit formed of conductive meshes that are intersected with each other; and a mesh frame for surrounding the mesh unit to support the mesh unit and to define an effective display area on a screen.

The mesh unit is formed by patterning a two-layered base film of PEP (poly ethylene terephthalate) and metal foils.

The mesh frame has a two-layered structure including PEP (poly ethylene terephthalate) and metal foils.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
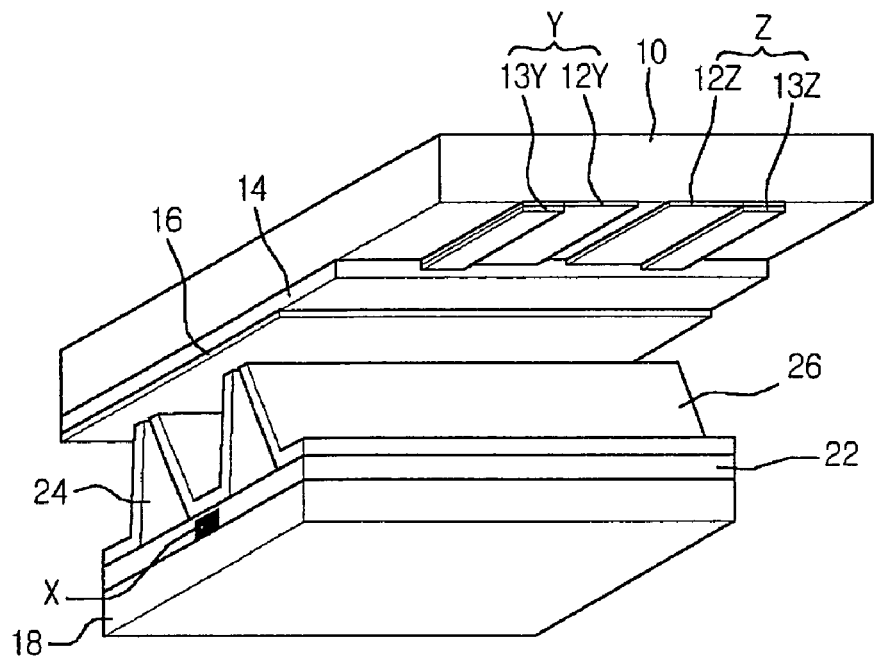
FIG. 1 is a perspective view of a related art discharge cell in a plasma display panel.
Figure 2:
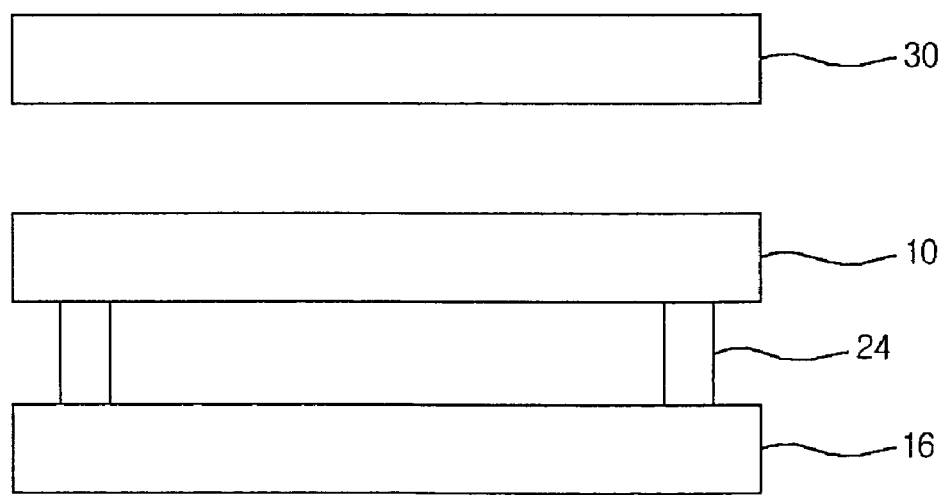
FIG. 2 diagrammatically illustrates the installation of a front filter on an upper substrate in order to shield electromagnetic waves and to prevent reflection of external light.
Figure 3:
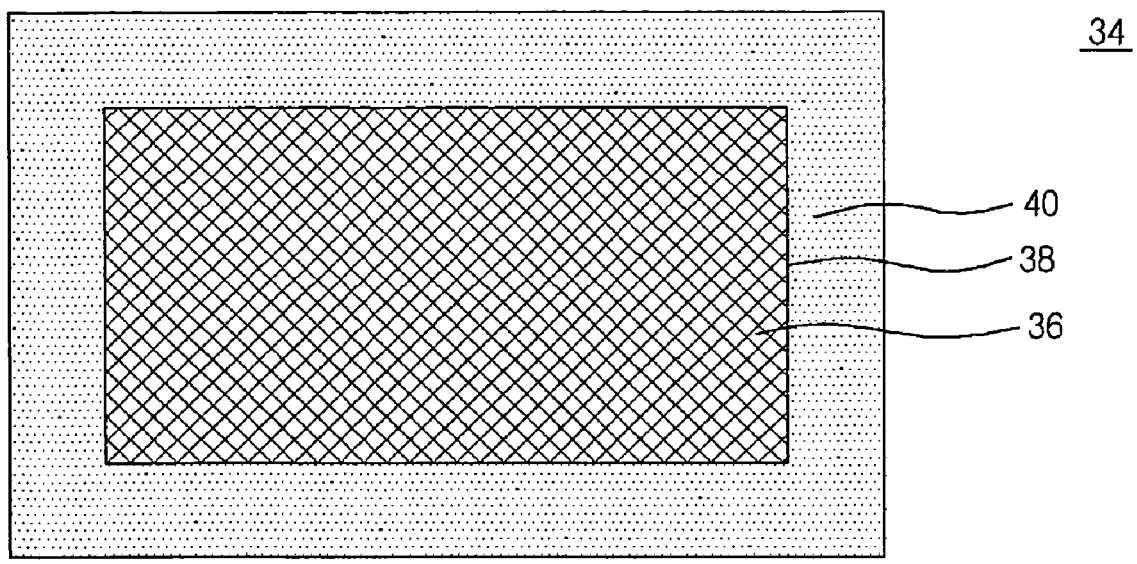
FIG. 3 illustrates a related art EMI (electromagnetic interference) shielding film.
Figure 4:
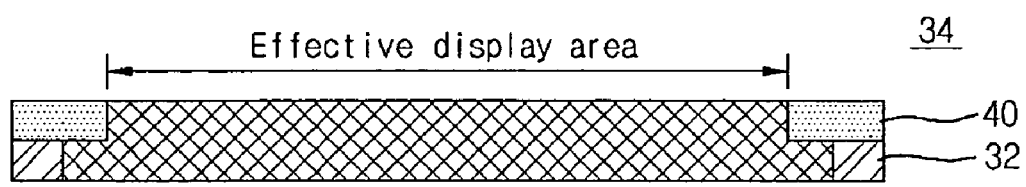
FIG. 4 is a cross-sectional view of a related art EMI shielding film.
Figure 5:
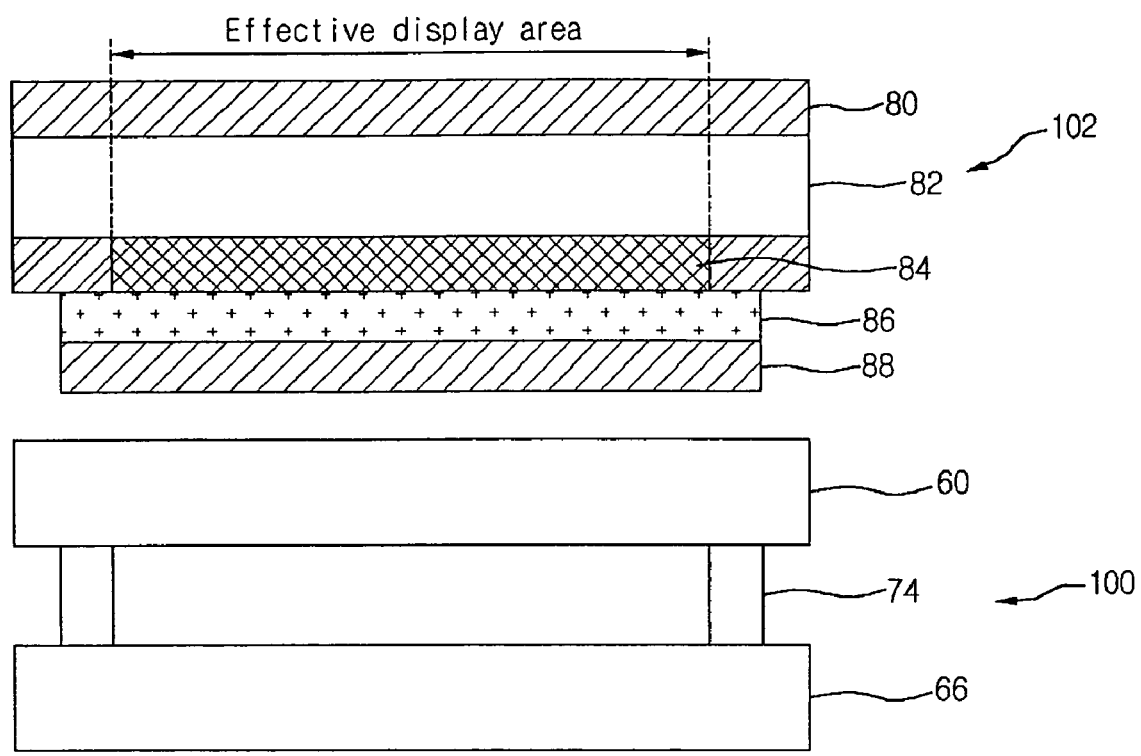
FIG. 5 is a cross-sectional view of a front filter in accordance with a first embodiment of the present invention.
Figure 6:
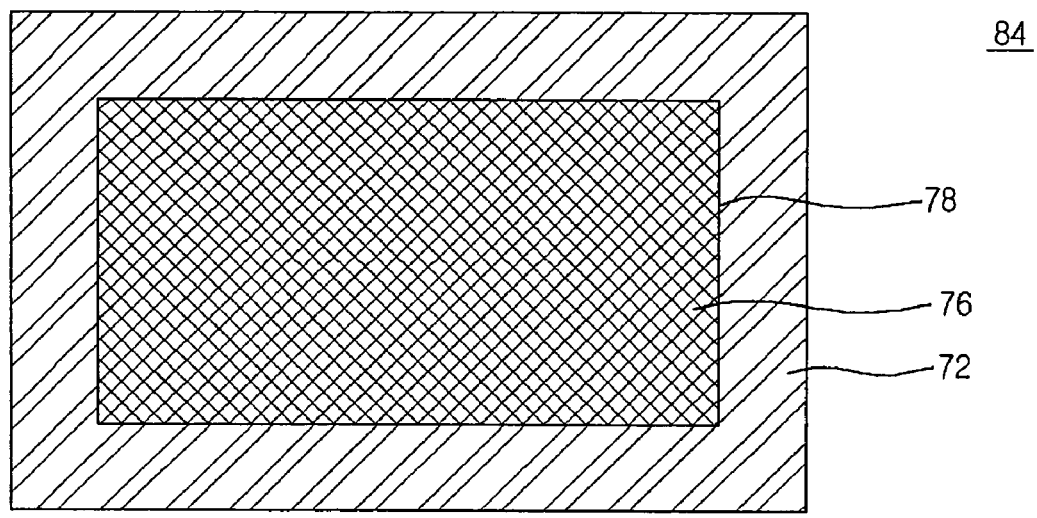
FIG. 6 illustrates an EMI shielding film according to the present invention.
Figure 7:
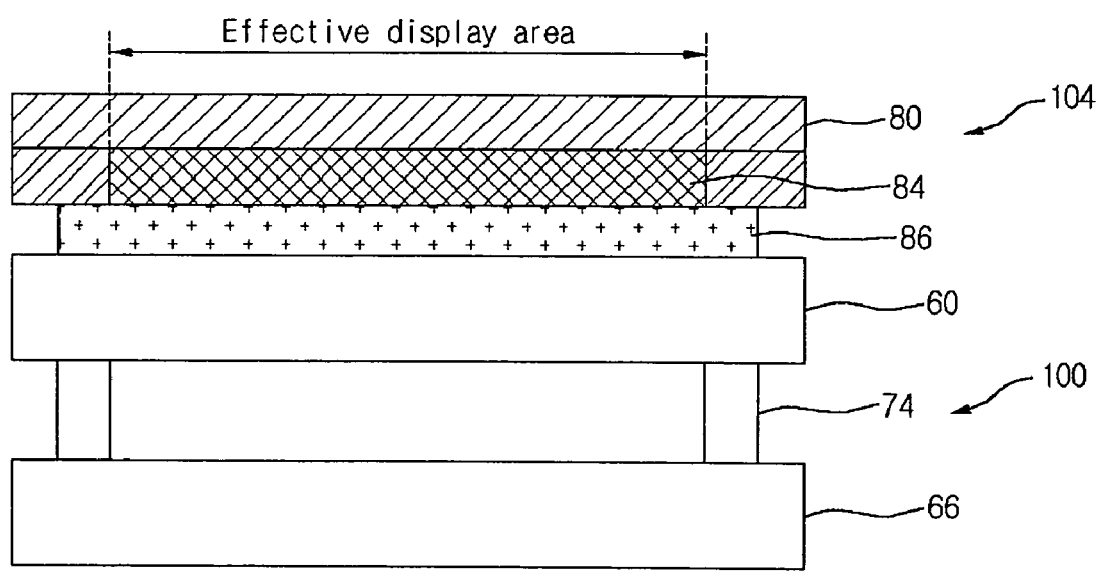
FIG. 7 is a cross-sectional view of a PDP including a front filter in accordance with a second embodiment of the present invention.

The following detailed description will present preferred embodiments of the invention in reference to the accompanying drawings FIGS. 5 to 7.

FIG. 5 is a cross-sectional view of a glass type front filter in accordance with a first embodiment of the present invention.

Referring to FIG. 5, the glass type front filter 102 includes a first antireflection coating 80 attached to a front surface of a glass substrate 82, an EMI shielding film 84, a NIR (near infrared ray) blocking film 86, and a second antireflection coating 88, the EMI shielding film 84, the NIR blocking film 86 and the second antireflection coating 88 being adhered to a rear surface of the glass substrate 82 in cited order. The glass type front filter 102 shields electromagnetic waves generated to the front surface of a PDP 100, prevents reflection of external light, blocks near infrared rays, and corrects colors.

The glass substrate 82 is made from a reinforced glass to support the glass type front filter 102 and to protect the front filter 102 and the PDP 100 from damages caused by external impacts.

The first and second antireflection coatings 80 and 88 prevent incident light rays from outside from being reflected back to the outside and thus, improve contrast effects.

The EMI shielding film 84 absorbs electromagnetic waves generated from the PDP 100, and shields the emission of the electromagnetic waves to outside.

The NIR blocking film 86 absorbs near infrared rays at a wavelength band of 800-1000 nm that are generated from the PDP 100, and blocks the emission of the near infrared rays to outside. This is how infrared rays (approximately 947 nm) generated from a remote controller are normally input to an infrared ray receiver built in the PDP set. Moreover, the NIR blocking film 86 includes a color correcting film containing a color dye that increases color purity by adjusting or correcting colors. These films 80, 84, 86 and 88 are adhered to the glass substrate 82 through an adhesive or glue.

The glass type front filter 102 is installed at the front surface of the plasma display panel 100. The plasma display panel 100 includes an upper substrate 60 provided with a pair of sustain electrodes, and a lower substrate 66 provided with an address electrode. As for the plasma display panel 100, a barrier rib 74 is interposed between the upper and lower substrates 60 and 66.

As shown in FIG. 6, the EMI shielding film 84 according to the first embodiment of the invention includes a mesh unit 78 formed of conductive meshes 76, and a mesh frame 72 for surrounding the outside of the mesh unit 78.

The mesh unit 78 is obtained by etching a two-layered base film comprised of PET (poly ethylene terephthalate) and metal foils. The mesh unit 78 is formed of conductive meshes 76 in an intersection structure. To create the conductive meshes 76, a mesh metal layer of silver (Ag), copper (Cu), gold (Au) or aluminum (Al) undergoes a photolithography process. These intersected conductive meshes 76 provide square shaped holes tilted at a bias angle (θ) to transmit visible light rays therethrough.

The mesh frame 72 surrounds the outside of the mesh unit 78 to support the mesh unit 78 and at the same time, to define an effective display area, thereby making outlines of the screen visibly distinctive. Also, the mesh frame 72 is a non-etched metal layer, which is formed by masking the outside area of the mesh unit 78 under the etching process.

Therefore, the mesh frame 72 has a two-layered structure where PEP (poly ethylene terephthalate) and metal foils are alternated with each other.

Similar to the conductive meshes 76, the metal foil is made from silver (Ag), copper (Cu), gold (Au) or aluminum (Al).

More specifically speaking, the surface of the metal foil of the mesh frame 72 is melanized. Preferably, the surface of the metal foil is any one of black, brown and gray colors.

The surface of the metal foil is melanized through an electrochemical treatment, a selective printing, or being coating with a compound film. The electrochemical treatment involves oxidation or electroless plating for example.

In other words, the surface of the metal foil can be oxidized or coated with a compound film. Also, the surface of the metal foil can be printed in ink or dye.

The surface treatment process on the metal foil is performed after the mesh unit 78 and the mesh frame 72 are formed. It is also possible to treat the surface of base film first, the base film having the two-layered structure of PET and metal foil, and to form the mesh unit 78 and the mesh frame 72 later.

In addition, the mesh frame 72 and a case (not shown) electrically connected to the mesh frame 72 are earthed to a ground voltage, and absorb electromagnetic waves emitted from the PDP and discharge them. This is how the mesh frame 72 prevents the electromagnetic waves from being emitted to outside.

The mesh frame 72 has the same width with the related art black frame.

FIG. 7 is a cross-sectional view of a PDP including a film type front filter according to the second embodiment of the invention.

As shown in FIG. 7, the film type front filter 104 includes a NIR (near infrared ray) blocking film 86, an EMI shielding film 84, and an antireflection coating 80, the NIR blocking film 86, the EMI shielding film 84, and the antireflection coating 80 being adhered to an upper substrate 60 of a PDP 100 in cited order. Since the NIR blocking film 86 and the antireflection coating 80 are already explained in detail with reference to FIG. 5, further description will not be provided here.

As illustrated in FIG. 6, a mesh frame 72 of the EMI shielding film 84 surrounds the outside area of the mesh unit 78 to support the mesh unit 78 and at the same time, to define an effective display area, thereby making outlines of the screen visibly distinctive.

In addition, the mesh frame 72 and a case (not shown) electrically connected to the mesh frame 72 are earthed to a ground voltage, and absorb electromagnetic waves emitted from the PDP and discharge them. This is how the mesh frame 72 prevents the electromagnetic waves from being emitted to outside.

The mesh frame 72 has the same width with the related art black frame. To define the effective display area, a metal layer made from Ag, Cu, Au or Al for example undergoes a patterning process, and the surface of the metal foil is melanized. To be more specific, the surface of the metal foil is melanized through an electrochemical treatment, a selective printing, or being coating with a compound film. The electrochemical treatment involves oxidation or electroless plating for example.

Because the film type front filter 104 according to the second embodiment of the invention is attached to the upper substrate 60 of the PDP 100, it does not require the glass substrate 82 that was used for the glass type front filter 102 of FIG. 5. Therefore, the film type front filter 104, compared to the glass type front filter 104, is more effective for manufacturing slimmer and lighter PDP sets.

In conclusion, the present invention has simplified the manufacture process and reduced the cost of manufacturing involved in the EMI shielding film and the front filter including the same.

While the invention has been shown and described with reference to certain preferred embodiments thereof, it will be understood by those skilled in the art that various changes in form and details may be made therein without departing from the spirit and scope of the invention as defined by the appended claims.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A front filter attached to a front surface of a flat panel display device, the front filter comprising: a near infrared ray (NIR) blocking film for blocking the emissions of near infrared rays; an electromagnetic interference (EMI) shielding film for absorbing electromagnetic waves and preventing emissions of the electromagnetic waves, the EMI shielding film comprising: a front surface comprising a visible first surface and a visible second surface; a mesh unit comprising conductive meshes that are intersected with each other, the mesh unit further comprising the visible second surface; and a mesh frame surrounding the mesh unit to support the mesh unit, the mesh frame comprising the visible first surface, wherein the mesh frame is melanized to provided a melanized mesh frame, such that the visible first surface of the melanized mesh frame comprises a darker color than the visible second surface of the mesh unit to distinguish an effective display area corresponding to the mesh unit from a surrounding area corresponding to the mesh frame, and wherein the visible first surface is on a same plane as the visible second surface; a glass formed on the front surface of the EMI shielding film; and a first antireflection coating to preventing the reflection of incident rays, wherein the melanized mesh frame is formed by etching a two-layered base film comprising of polyethylene terephthalate (PET) and a metal foil.

2. The front filter of claim 1, further comprising a second antireflection coating between the front surface of the flat panel display device and the NIR blocking film to prevent reflection of the incident rays.

3. The front filter of claim 1, wherein the metal foil comprises at least silver (Ag), copper (Cu), gold (Au), or aluminum (Al).

4. The front filter of claim 3, wherein the metal foil is oxidized.

5. The front filter of claim 3, wherein the metal foil is coated with a compound film.

6. The front filter of claim 3, wherein a surface of the metal foil is printed with ink or dye.

7. The front filter of claim 1, wherein the mesh unit is not melanized.

* * * * *